United States Patent [19]
Komori et al.

[11] Patent Number: 6,046,937
[45] Date of Patent: Apr. 4, 2000

[54] ELECTRONIC CONTROL UNIT AND METHOD FOR STORING REWRITE COUNT OF NONVOLATILE MEMORY

[75] Inventors: Hirokazu Komori, Okazaki; Haruhiko Kondo, Anjo, both of Japan

[73] Assignee: Denso Corporation, Kariya, Japan

[21] Appl. No.: 09/335,046

[22] Filed: Jun. 16, 1999

[30]     Foreign Application Priority Data

Jul. 28, 1998   [JP]   Japan .................................. 10-212584

[51] Int. Cl.⁷ ................................................. G11C 16/04
[52] U.S. Cl. ........................ 365/185.04; 365/185.08; 365/185.33
[58] Field of Search .................... 365/185.04, 185.08, 365/185.33

[56]             References Cited
              U.S. PATENT DOCUMENTS 5,572,466   11/1996   Sukegawa .......................... 365/185.33
5,828,977   10/1998   Hayashi et al. ........................ 701/115

*Primary Examiner*—Trong Phan
*Attorney, Agent, or Firm*—Nixon & Vanderhye P.C.

[57]            ABSTRACT

An electronic control unit includes a flesh memory for storing control programs and data. A count information storage region for retaining a rewrite count of the flash memory is set up at a plurality of consecutive addresses in the flash memory. Each time rewriting processing is carried out by a CPU for the flash memory in the electronic control unit, a data-unwritten address in the count information storage region is selected in ascending order of addresses starting from the top address thereof, and numeric value data representing a rewrite count of the flash memory is written to the address thus selected.

8 Claims, 7 Drawing Sheets

FIG. 2
| ADDRESS: | 0001h | 0002h | 0003h | 0004h | 0005h | ··· | 00C7h | 00C8h |
|---|---|---|---|---|---|---|---|---|
| 0TH TIME: | FFh | FFh | FFh | FFh | FFh | ··· | FFh | FFh |
| 1ST TIME: | 01h | FFh | FFh | FFh | FFh | ··· | FFh | FFh |
|---|---|---|---|---|---|---|---|---|
| 2ND TIME: | 01h | 02h | FFh | FFh | FFh | ··· | FFh | FFh |
|---|---|---|---|---|---|---|---|---|
| 3RD TIME: | 01h | 02h | 03h | FFh | FFh | ··· | FFh | FFh |
|---|---|---|---|---|---|---|---|---|
| 200TH TIME: | 01h | 02h | 03h | 04h | 05h | ··· | C7h | C8h |
|---|---|---|---|---|---|---|---|---|

FIG. 6

```
(TOP ADDRESS : FF38)
(END ADDRESS : FFFF)

00 01 02 03 04 05 06 07   08 09 0A 0B 0C 0D 0E 0F
       ----------------------------------------------------
FF30:                                01 02 03 04 05 06 07 08
FF40:  09 0A 0B 0C 0D 0E 0F 10      11 12 13 14 15 16 17 18
FF50:  19 1A 1B 1C 1D 1E 1F 20      21 22 23 24 25 26 27 28
FF60:  29 2A 2B 2C 2D 2E 2F 30      31 32 FF FF FF FF FF FF
FF70:  FF FF FF FF FF FF FF FF      FF FF FF FF FF FF FF FF
FF80:  FF FF FF FF FF FF FF FF      FF FF FF FF FF FF FF FF
FF90:  FF FF FF FF FF FF FF FF      FF FF FF FF FF FF FF FF
FFA0:  FF FF FF FF FF FF FF FF      FF FF FF FF FF FF FF FF
FFB0:  FF FF FF FF FF FF FF FF      FF FF FF FF FF FF FF FF
FFC0:  FF FF FF FF FF FF FF FF      FF FF FF FF FF FF FF FF
FFD0:  FF FF FF FF FF FF FF FF      FF FF FF FF FF FF FF FF
FFE0:  FF FF FF FF FF FF FF FF      FF FF FF FF FF FF FF FF
FFF0:  FF FF FF FF FF FF FF FF      FF FF FF FF FF FF FF FF
```

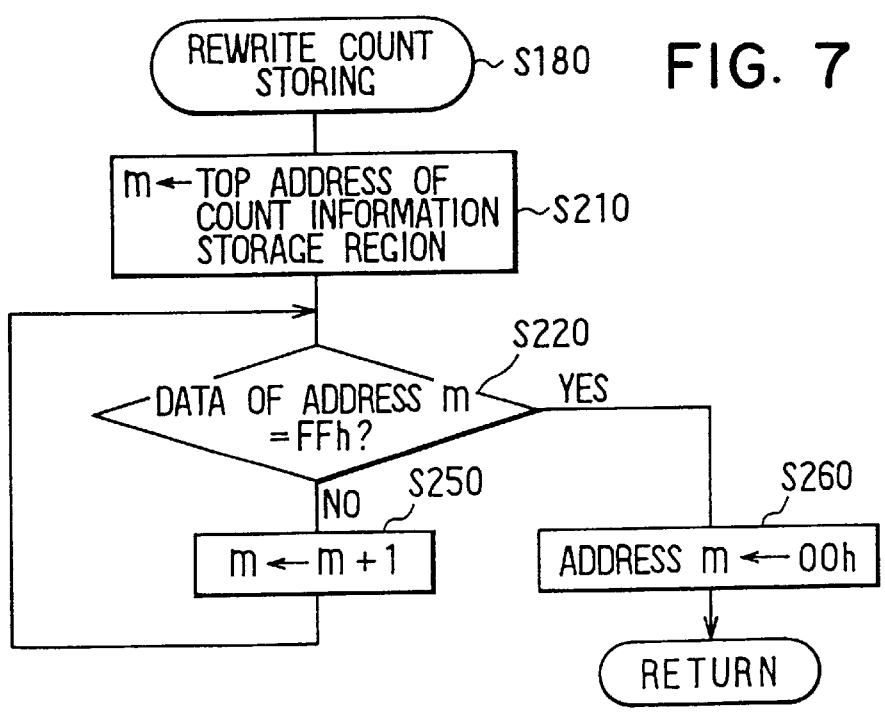

FIG. 7

ELECTRONIC CONTROL UNIT AND METHOD FOR STORING REWRITE COUNT OF NONVOLATILE MEMORY

CROSS REFERENCE TO RELATED APPLICATION

This application relates to and incorporates herein by reference Japanese Patent Application No. 10-212584 filed on Jul. 28, 1998.

BACKGROUND OF THE INVENTION

1. Field of the Invention

The present invention relates to an electronic control unit, which executes on-board rewriting of control programs and control data used for regulating operations of predetermined mechanisms or objects to be controlled. More particularly, the invention pertains to an apparatus and a method by which a rewrite count of control programs and control data stored in a nonvolatile memory is stored into a specific storage region of the nonvolatile memory.

2. Description of Related Art

In a conventional electronic control unit which is in practical use for controlling such objects as an engine and transmission of an automobile, there is provided a nonvolatile read-only memory that is electrically erasable and rewritable, such as a flash memory or EEPROM (hereinafter also referred to as an electrically rewritable ROM). The electrically rewritable ROM is so designed that control programs and control data stored therein can be rewritten in after the production of the electronic control unit.

In normal operation, this kind of electronic control unit controls an engine and other control objects according to control programs and control data stored in the electrically rewritable ROM thereof. When an external memory rewriting device is connected to the electronic control unit and a rewrite command is issued, the electronic control unit recognizes that a rewrite condition is met. Then, the electronic control unit performs transition to a rewrite mode, and in the rewrite mode, the contents of the electrically rewritable ROM are replaced with new contents (program and/or data) received from the memory rewriting device.

In the electronic control unit having the above onboard rewritable memory, it is rather easy to cope with a possible requirement that an operation sequence (control sequence) is to be altered due to any cause after placement on the market.

However, in the flash memory or EEPROM employed as an electrically rewritable ROM in the electronic control unit, a limitation is imposed on the allowable maximum number of times the contents stored therein may be rewritten (i.e., an allowable maximum erase/rewrite count of the contents of the memory).

Therefore, in the above electronic control unit, a rewrite count of the contents stored in the electrically rewritable ROM (hereinafter also referred to as a rewrite count of the electrically rewritable ROM or just as a rewrite count) is retained in a count information storage region allocated in the electrically rewritable ROM so that the contents of the electrically rewritable ROM will not be rewritten repeatedly beyond an allowable maximum rewrite count guaranteed for the electrically rewritable ROM.

In this kind of electrically rewritable ROM, all the bits of memory data are "1s" under a data-unwritten condition, and information can be added just by changing each bit data from "1" to "0" without having to perform an erase operation. On this ground, an approach has been proposed in which bit data is used to represent count information and each bit "0" is additionally written in the count information storage region of the electrically rewritable ROM.

However, this approach of additionally writing each bit "0" has a disadvantage that a rewrite count cannot be attained easily just by checking data in the count information storage region.

More specifically, in this conventional electronic control unit, there may occur that an automobile repair shop mechanic needs to know a current rewrite count of the electrically rewritable ROM when attempting to rewrite the contents stored in the electrically rewritable ROM. In this situation, using the memory rewriting device, the mechanic instructs the electronic control unit to send addresses and data of the count information storage region to the memory rewriting device. Thus, through the memory rewriting device, the mechanic produces a memory dump on a display monitor or paper so that each address and data received from the electronic control unit are presented in an associated fashion. By studying the memory dump, the mechanic can know the contents of the count information storage region in the electrically rewritable ROM. However, where this approach of additionally writing each bit "0" is employed, it is not easy to check the current rewrite count of the electrically rewritable ROM using the memory dump thus attained.

Further, in the flash memory, EEPROM or any similar electrically rewritable ROM, there is a possibility of "bit garbling" that any bit data is erroneously changed from "0" to "1" or vice versa on rare occasion.

Where each bit "0" is additionally written in each rewriting processing, it becomes impossible to determine an accurate value of the current rewrite count of the electrically rewritable ROM if any one of garbled bit patterns (1) to (4) described below occurs in the vicinity of a boundary between a bit string having "0s" already written and a bit string in which "0s" are not yet written (i.e., a bit string having "1s" intact) as exemplified in FIG. 9.

Garbled Bit Pattern (1)

With respect to the boundary between bit "bn" belonging to the bit string having "0s" already written and bit "bn+1" belonging to the bit string in which "0s" are not yet written, bit "bn" that must have "0" already written is garbled to "1". In this case, the current rewrite count of the electrically rewritable ROM is erroneously determined to be smaller than an actual correct count by one increment.

Garbled Bit Pattern (2)

With respect to the boundary between bits "bn" and "bn+1", bit "bn+1" that must not yet have "0" written is garbled to "0". In this case, the current rewrite count of the electrically rewritable ROM is mis executedly determined to be larger than an actual correct count by one increment.

Garbled Bit Pattern (3)

With respect to the boundary between bits "bn" and "bn+1", bit "bn−1" (immediately subsequent to bit "bn") that must have "0" already written is garbled to "1". In this case, an accurate rewrite count cannot be known since which one of bits "bn" and "bn−1" is garbled cannot be determined.

Garbled Bit Pattern (4)

With respect to the boundary between bits "bn" and "bn+1", bit "n+2" (immediately preceding bit "n+1") that must not yet have "0" written is garbled to "0". In this case, an accurate rewrite count cannot be known since which one of bits "bn+2" and "bn+1" is garbled cannot be determined.

Therefore, where th e above approach of additionally writing each bit "0" is employed in each rewriting processing, the mechanic may not attain an accurate value of the current rewrite count of the electrically rewritable ROM by checking the memory dump. Further, an accurate value of the current rewrite count cannot be attained in case the electronic control unit is so designed that it reads out data from the count information storage region of the electrically rewritable ROM before the start of rewriting processing and then forms a determination to indicate whether or not the current rewrite count of the electrically rewritable ROM has reached an allowable maximum rewrite count guaranteed for the electrically rewritable ROM.

SUMMARY OF THE INVENTION

It is therefore an object of the present invention to obviate the above disadvantages by an electronic control unit designed to allow rewriting control programs and control data stored in a nonvolatile memory and to store a rewrite count of the contents of the nonvolatile memory into a specific storage region of the nonvolatile memory, wherein a rewrite count of the contents of the nonvolatile memory can be checked with ease, and wherein high accuracy in a rewrite count of the contents of the nonvolatile memory is ensured even if any bit is garbled in the specific storage region of the nonvolatile memory.

In accomplishing this object of the present invention and according to one aspect thereof, a count information storage region is set up as a memory area covering a plurality of addresses in an electrically rewritable ROM which is equivalent to a nonvolatile memory. In each rewriting processing, one of addresses at which data is not yet written is selected in the count information storage region, and numeric value data is written to the selected address as count information representing a rewrite count of the contents stored in the electrically rewritable ROM.

Further, since numeric value data (count value data) which directly represents a rewrite count is additionally written in the count information storage region of the electrically rewritable ROM (instead of writing each bit "0" as in the conventional arrangement), a rewrite count of the electrically rewritable ROM can be known easily in a memory dump which is produced on an external device by transferring addresses and data in the count information storage region from the electronic control unit to the external device.

BRIEF DESCRIPTION OF THE DRAWINGS

The above and other objects, features and advantages of the present invention will become more apparent from the following detailed description with reference to the accompanying drawings. In the drawings:

FIG. 2 is an explanatory diagram concerning a count information storage region allocated in a flash memory;

FIG. 6 is a diagram showing an example of a memory dump list;

FIG. 7 is a flow diagram showing a rewrite count storing processing procedure carried out in the ECU in a second preferred embodiment of the present invention;

DETAILED DESCRIPTION OF THE PREFERRED EMBODIMENTS

The present invention will now be described in detail by way of example with reference to the accompanying drawings.

(First Embodiment)

Figure 1:
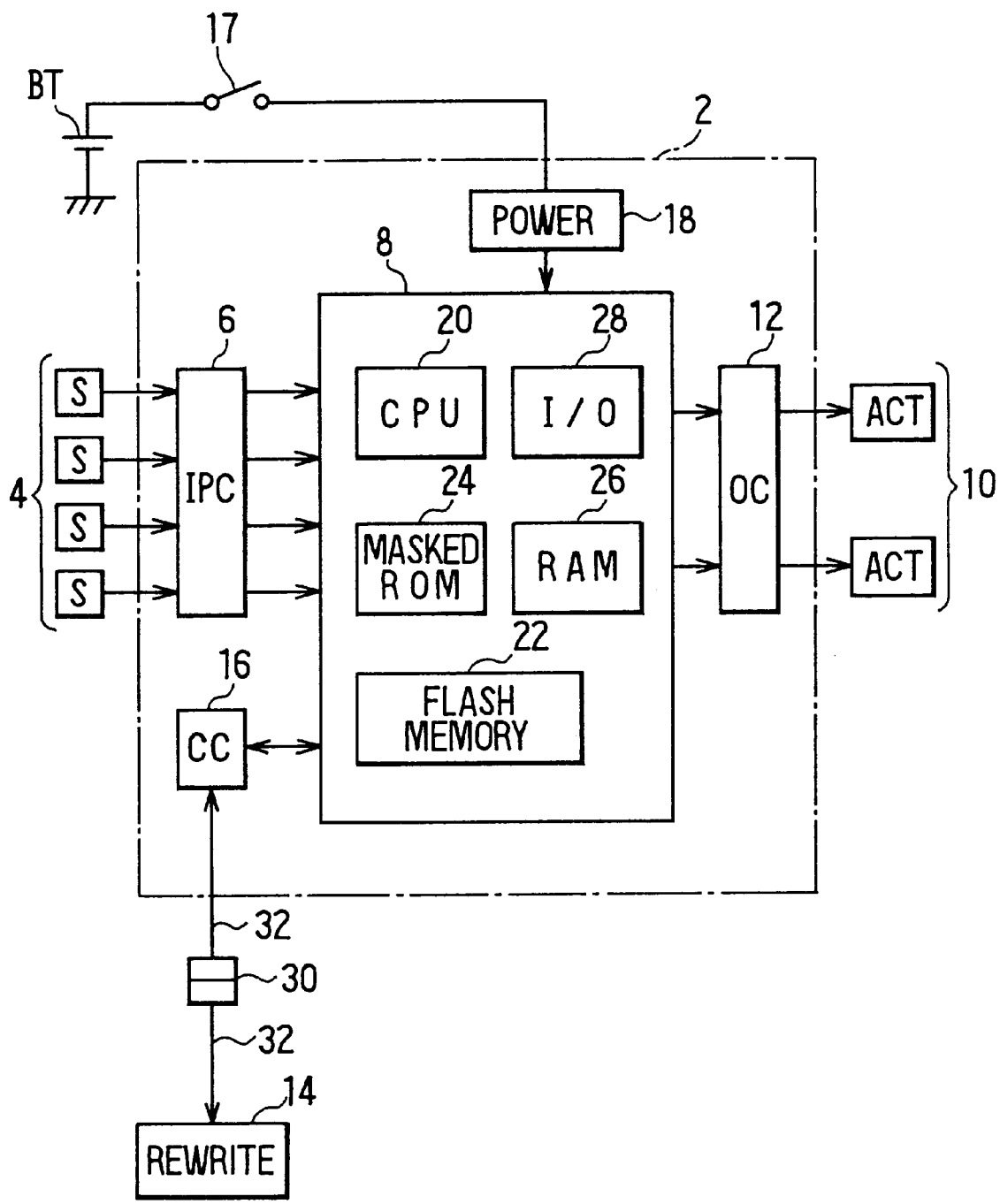
FIG. 1 is a block diagram showing an electronic control unit (ECU) in a first preferred embodiment of the present invention.

Referring to FIG. 1, an electronic control unit (ECU) 2 is mounted on a vehicle (automobile) for controlling an internal combustion engine (not shown) in a first preferred embodiment of the present invention. The ECU 2 comprises an input processing circuit (IPC) 6 for performing waveform processing of input signals received from sensors (S) 4 equipped to detect operating conditions of the engine, a microcomputer 8 for carrying out various engine control processing operations according to sensor signals from the input processing circuit 6, an output circuit (OC) 12 for driving actuators (ACT) 10 mounted on the engine such as a fuel injector and igniter according to control signals from the microcomputer 8, a communication circuit (CC) 16 for serial data communication with a memory rewriting device 14 to be connected as an external device, and a power supply circuit 18 for receiving power from a battery BT when an ignition switch 17 of the vehicle is turned on and supplying a power voltage (e.g., 5 V) for operating the microcomputer 8 and other circuits.

The power supply circuit 18 is provided with a power-on reset function, which is designed to output a reset signal to the microcomputer 8 for a predetermined time period to be taken until the power voltage becomes stable after the ignition switch 17 is turned on to start supplying the power voltage.

The microcomputer 8 comprises a known central processing unit (CPU) 20 which operates according to programs, a nonvolatile flash memory 22 and a masked ROM 24 for storing programs (more particularly, data constituting programs) necessary for operating the CPU 20 and data to be referenced in execution of programs, a volatile RAM 26 for temporarily storing results of calculations carried out by the CPU 20, an input/output (I/O) circuit 28 for communicating signals and data with the input processing circuit 6, output circuit 12 and communication circuit 16, and various register circuits (not shown).

The flash memory 22 is a nonvolatile read-only memory capable of electrically erasing and rewriting contents therein (electrically rewritable ROM). In the present preferred embodiment, the flash memory 22 is arranged to store 8-bit data per address. More specifically, a program for controlling the engine (hereinafter referred to as an engine control program) and control data to be referenced for controlling the engine in execution of the engine control program are stored in the flash memory 22.

In the present preferred embodiment, as shown in the top row in FIG. 2, 200 consecutive storage locations from address 0001h to address 00C8h in the flash memory 22 are set up as a count information storage region for retaining a rewrite count of the contents (i.e., the engine control program and control data) stored in the flash memory 22. The count information storage region is protected against rewriting data under normal operating condition, and the engine control program and control data are held in storage areas other than the count information storage region.

In the detailed description given herein, an alphanumeric character string, including any of digits 0 to 9 and letters A to F, which is suffixed with "h", e.g., 0001h or 00C8h indicated above, represents a numeric value in hexadecimal notation.

Before the ECU 2 is assembled in production, the flash memory 22 has no data and all the data value bits of each address are set at "1" which corresponds to FFh (225 in decimal notation). In a production process of the ECU 2, after the microcomputer 8 is mounted on the ECU 2, the engine control program and control data are written into storage areas other than the count information storage region in the flash memory 22. In the following description, it is assumed that the engine control program and control data have been already written in the ECU 2.

In contrast, the masked ROM 24 is a read-only nonvolatile memory which does not permit rewriting the contents stored therein. A boot program to be executed immediately after the microcomputer 8 is reset for clearing is prestored in the masked ROM 24.

When the engine control program or control data stored in the flash memory 22 is to be replaced with a new program or new data, the memory rewriting device 14 is connected to the ECU 2. As shown in FIG. 1, the ECU 2 and the memory rewriting device 14 are interconnected via a connector 30 to provide a signal communication line 32 therebetween. With the connector 30 engaged, the microcomputer 8 in the ECU 2 can perform serial data communication with the memory rewriting device 14 through the communication circuit 16 and communication line 32.

In the ECU 2, when the microcomputer 8 is reset for clearing and started from an initial state thereof, the boot program prestored in the masked ROM 24 is carried out first. Under normal operating condition that the memory rewriting device 14 is not connected, the boot program calls the engine control program stored in the flash memory 22 for carrying out an engine control processing procedure for controlling the engine.

If the microcomputer 8 determines that a rewrite condition (to be described later) is satisfied in execution of the boot program or in execution of the engine control processing, the microcomputer 8 receives a rewrite program from the memory rewriting device 14 and loads or transfers the same onto the RAM 26. Then, on the RAM 26, the rewrite program is run to carry out a rewriting processing procedure for replacing any part or the whole of the engine control program or control data stored in the flash memory 22 with new data (i.e., new engine control program data and new control data) received from the memory rewriting device 14.

Figure 3:
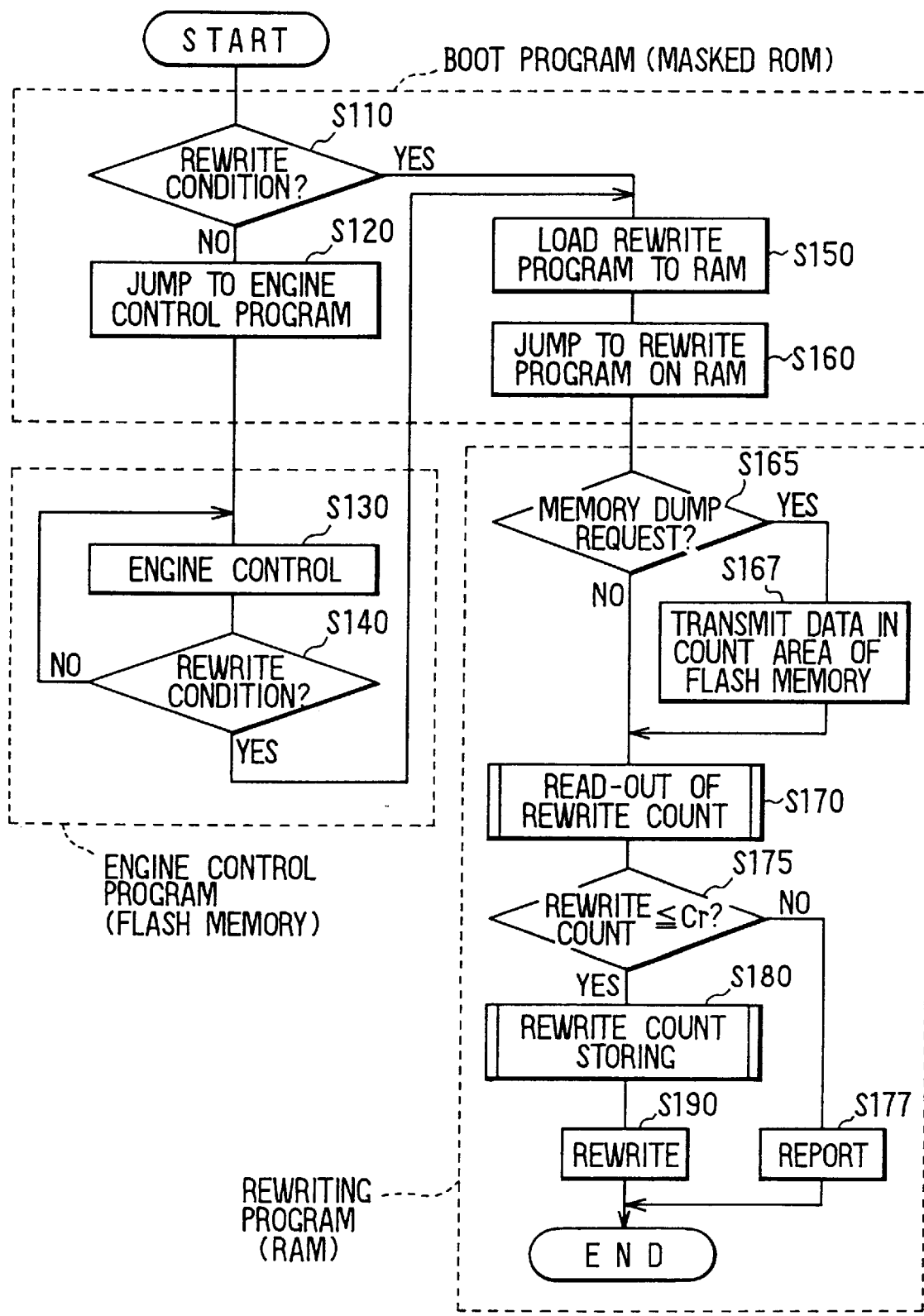
FIG. 3 is a general flow diagram showing the entire processing carried out in the ECU in the first preferred embodiment of the present invention.
Figure 4:
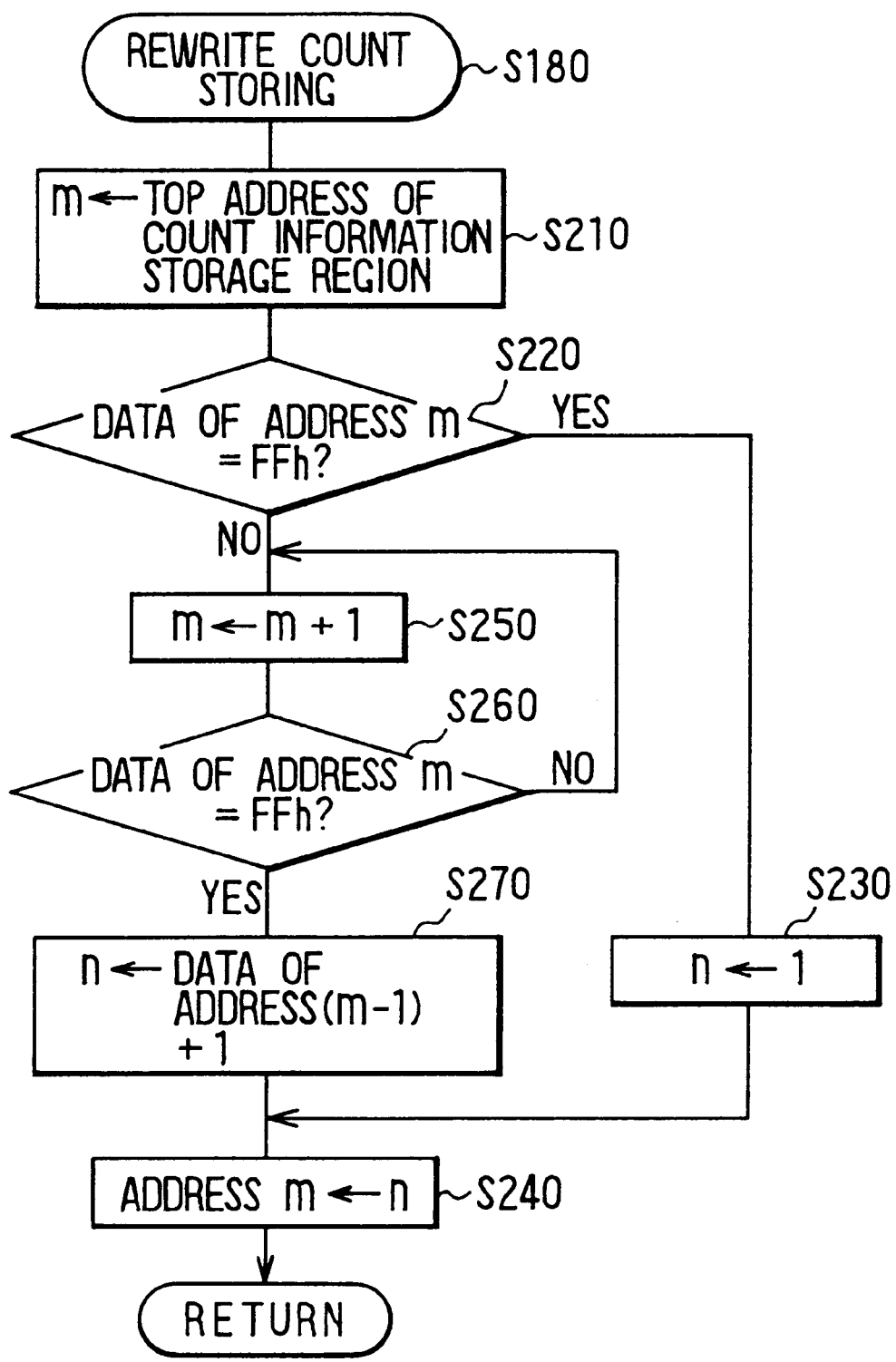
FIG. 4 is a flow diagram showing a rewrite count storing processing procedure carried out in the ECU in the first preferred embodiment of the present invention.
Figure 5:
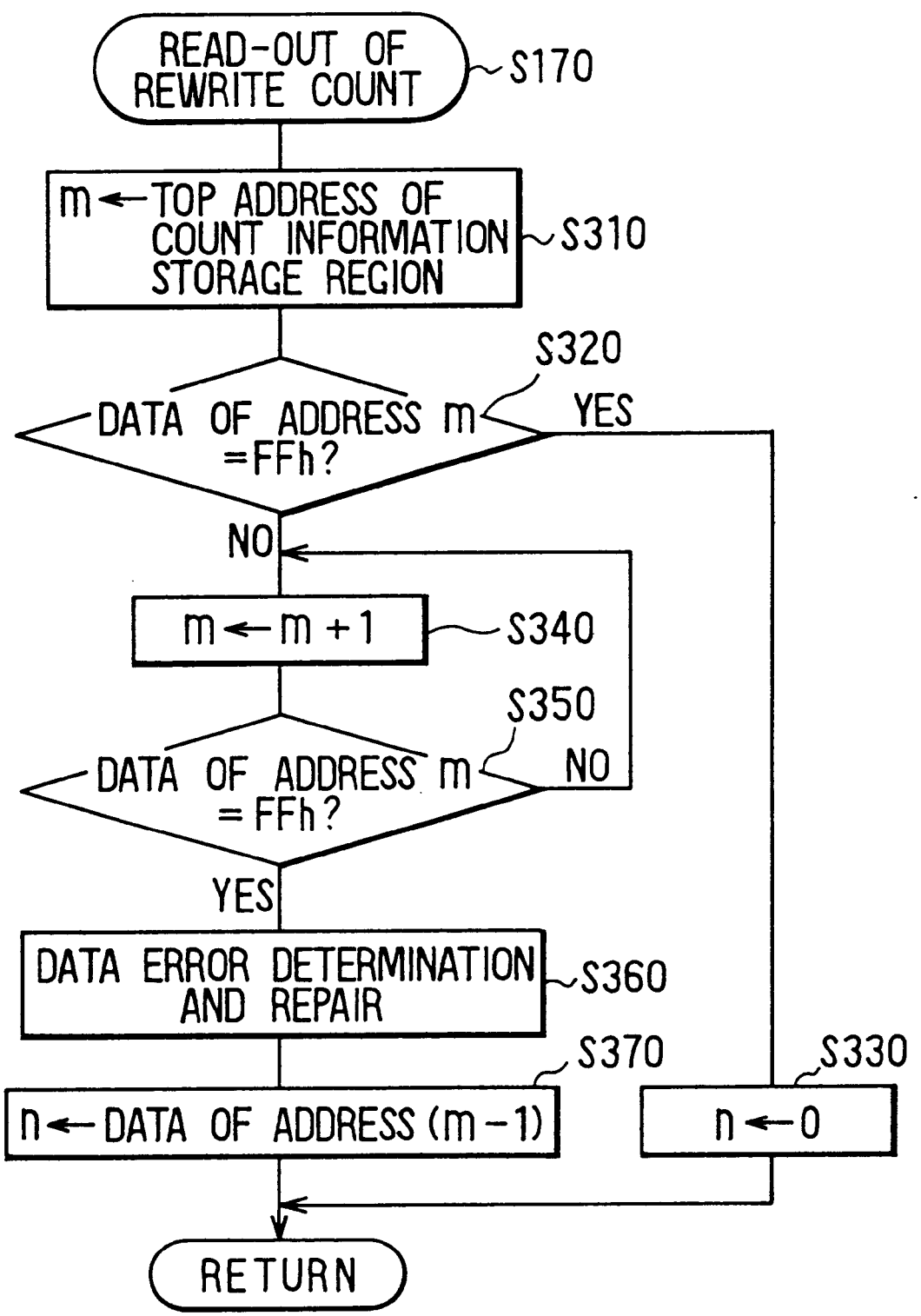
FIG. 5 is a flow diagram showing a rewrite count read-out processing procedure carried out in the ECU in the first preferred embodiment of the present invention.

The microcomputer 8 in the ECU 2 carries out the processing procedures as shown in FIGS. 3 to 5.

In the processing shown in FIG. 3, processing steps S100, S120, S150 and S160 are executed by the boot program prestored in the masked ROM 24. ("S" prefixed to a reference numeral stands for "step"). Processing steps S130 and S140 are executed by the engine control program stored in the flash memory 22, and processing steps S165 to S190 are executed by the rewrite program loaded from the memory rewriting device 14 to the RAM 16.

As shown in FIG. 3, when the ignition switch 17 is turned on, the microcomputer 8 starts its operation from the initial (reset) state to execute the boot program prestored in the masked ROM 24. First, at step S110, it is determined whether a rewrite condition for replacing the contents stored in the flash memory 22 is satisfied or not. In the present preferred embodiment, it is determined that the rewrite condition is satisfied when a rewrite command indicating an instruction to rewrite the contents of the flash memory 22 is issued from the memory rewriting device 14 connected to the ECU 2 through the communication line 32 and the rewrite command is detected by the microcomputer 8 in reception interrupt processing or the like.

At step S110, if it is determined that the rewrite condition is not satisfied (S110: NO), a normal engine control mode is recognized to select step S120. Then, at step S120, a jump is made to the start address of the engine control program stored in the flash memory 22.

Thereafter, the engine control program stored in the flash memory 22 is called into execution to perform processing procedures of steps S130 and S140.

More specifically, at step S130, engine control processing is carried out to control the engine. In the engine control processing, an optimum fuel injection amount, ignition timing and other engine operating parameters are calculated according to various sensor signals received from the input processing circuit 6 and control data stored in the flash memory 22. Then, based on the results of calculation, control signals are delivered to the output circuit 12 for driving the actuators 10 including such devices as the fuel injector and igniter.

Since the engine control processing is carried out repeatedly, the engine is run continuously. Each time the engine control processing comes to an end, step S140 is executed before repetition of the engine control processing. At step S140, a determination is made to check whether or not the rewrite condition is satisfied as in the case of step S110. Then, if the rewrite condition is not satisfied (S140: NO), step S130 is executed again to repeat the engine control processing.

That is, each time the engine control processing (S130) is repeated, it is checked whether the rewrite condition is satisfied or not (S140). Unless the rewrite condition is satisfied, the engine control processing (S130) is continued repeatedly.

If it is determined that the rewrite condition is satisfied at step S110 of the boot program or at step S140 of the engine control program (S110: YES, or S140: YES), a rewrite mode for replacing the contents stored in the flash memory 22 is recognized to proceed to step S150 of the boot program. At step S150, the rewrite program received from the memory rewriting device 14 is loaded onto the RAM 26.

The memory rewriting device 14 is so designed as to issue the rewrite command and then send the rewrite program to the ECU 2 when a predetermined operation is performed on the memory rewriting device 14. Therefore, through processing at step S150, the microcomputer 8 in the ECU 2 receives the rewrite program from the memory rewriting device 14 and loads the same onto the RAM 26.

Then, upon completion of loading the rewrite program onto the RAM 26 at step S150, the next step S160 is executed to make a jump to the start address of the rewrite program loaded on the RAM 26.

The microcomputer 8 then executes the rewrite program on the RAM 26 to carry out processing procedures of steps S165 to S190.

More specifically, at step S165, it is determined whether or not a memory dump request is received from the memory rewriting device 14 within a predetermined period of time. If it is determined that the memory dump request is received from the memory rewriting device 14 (S165: YES), step S167 is executed to send addresses and data retained in the count information storage region of the flash memory 22 to the memory rewriting device 14. Then, on a CRT display or any other output device, the memory rewriting device 14 produces a dump list indicating each address and its associated data received from the ECU 2.

Then, after execution of step S167 or if it is determined at step S165 that the memory dump request is not received from the memory rewriting device 14 (S165: NO), step S170 is executed to carry out a rewrite count read-out processing procedure for attaining a rewrite count of the contents stored in the flash memory 22. The details of the rewrite count read-out processing will be described later with particular reference to FIG. 5.

Then, at step S175, a determination is formed to check whether or not a rewrite count of the flash memory 22 attained through the rewrite count read-out processing at step S170 is less than or equal to a predetermined reference value Cr. As this predetermined value Cr, an allowable maximum rewrite count guaranteed for the flash memory 22 (the number of times guaranteed for erasing and rewriting operations) may be set up in principle. In the present preferred embodiment, a value smaller than the actual allowable maximum rewrite count guaranteed for the flash memory 22 (e.g., 100) is set up in consideration of a safety margin and the number of addresses allocated in the count information storage region.

At step S175, if it is determined that a rewrite count of the flash memory 22 is larger than the predetermined value (S175: NO), step S177 is selected to carry out report processing. In the report processing, a report signal indicating that a rewrite count of the flash memory 22 has exceeded the predetermined value is sent to the memory rewriting device 14. Thereafter, the entire processing flow mentioned above comes to an end. When the memory rewriting device 14 receives the report signal at step S177, the memory rewriting device 14 stops communication with the ECU 2 while letting the display device indicate a message that the contents stored in the flash memory 22 cannot be rewritten anymore.

Contrarily, if it is determined at step S175 that a rewrite count of the flash memory 22 is less than or equal to the predetermined value (S175: YES), step S180 is selected since the flash memory 22 can be still in a rewritable condition.

At step S180, a rewrite count storing processing (FIG. 4) is carried out for storing an updated rewrite count of the flash memory 22 into the count information storage region of the flash memory 22 (to be detailed later). Then, at step S190, rewriting processing is carried out to replace the contents stored in the flash memory 22 with new data to be received from the memory rewriting device 14 (more particularly, new engine control program data and new control data).

The rewriting processing at step S190 is carried out through the following procedures (1) to (3):

(1) First, upon receiving an erase request from the memory rewriting device 14, previous data is removed from the storage area to be subjected to data rewriting in the flash memory 22.
(2) Next, when new data is received from the memory rewriting device 14, the received new data is written into the storage area from which the previous data has been removed in the above procedure (1).
(3) Then, the new data which has been written into the flash memory 22 in the above procedure (2) is read out for verification check. In the verification check, the new data read out of the flash memory 22 is compared with the new data received from the memory rewriting device 14 to examine whether the both data agree with each other. Then, after the result of the verification check is returned to the memory rewriting device 14, the rewriting processing is terminated.

As shown in FIG. 4, in the rewrite count storing processing of step S180 to be carried out immediately before each execution of the rewriting processing, the top address of the count information storage region of the flash memory 22 is assigned to a first register m in the microcomputer 8 at step S210.

Then, at step S220, data of an address matching a value of the first register m (hereinafter referred to as address m) is read from the count information storage region of the flash memory 22 to the RAM 26, in which it is determined whether the data of the address m is FFh or not.

If it is found at step S220 that the data of the address m is FFh (S220: YES), it signifies that count data is not yet written at the top address of the count information storage region. In this case, step S230 is selected to assign "1" (=01h) to a second register n in the microcomputer 8. Then, at step S240, a value of the second register n is written to the address m of the count information storage region (i.e., an address matching the value of the first register m). Thereafter, the rewrite count storing processing is terminated. Thus, in case that count data is not yet written at the top address of the count information storage region, 01h representing value "1" is written to the top address of the count information storage region.

Contrarily, if it is found at step S220 that the data of the address m is not FFh (S220: NO), step S250 is selected to increment the value of the first register m by one. Then, at step S260, the data of the address m is read from the count information storage region to the RAM 26, in which it is determined whether the data of the address m is FFh or not in the same manner as at step S220.

If it is found at step S260 that the data of the address m is not FFh (S260: NO), step S250 is executed again.

Contrarily, if it is found at step S260 that the data of the address m is FFh (S260: YES), step S270 is selected. At step S270, data of an address which is lower than the value of the first register m by one (i.e., an address immediately preceding the address m; hereinafter referred to as address (m−1)) is read from the count information storage region to the RAM 26.

Then, "1" is added to the data of the address (m−1), and the resultant value (=data value of address (m−1)+1) is assigned to the second register n. Thereafter, the above step S240 is performed, and then the rewrite count storing processing is terminated.

Thus, in the above rewrite count storing processing, a search is made for an address having data FFh (data-unwritten address) in the count information storage region in ascending order of addresses starting from the top address of the count information storage region (steps S210, S220, S250 and S260). Then, if the data of the top address is FFh (S220: YES), numeric value data representing "1" is written to the top address (steps S230 and S240). If the data of the top address is not FFh (S220: NO), the following numeric value data is written to an address having data FFh selected in the search; numeric value data which is larger than data stored at the immediately preceding address by one (steps S270 and S240).

Therefore, in the ECU 2 in the present preferred embodiment, each time the rewriting processing of step S190 shown in FIG. 3 is carried out, a data-unwritten address in the count information storage region is selected in ascending order of addresses starting from the top address of the count information storage region. Then, numeric value data directly representing a rewrite count of the flash memory 22 is written to the address thus selected.

As shown in FIG. 2, in case that the rewriting processing is carried out for the first time, numeric value data representing "1" (01h) is written to the top address (0001h) of the count information storage region. In case that the rewriting processing is carried out for the second time, numeric value data representing "2" (02h) is written to the second address (0002h) of the count information storage region. In case that the rewriting processing is carried out for the third time, numeric value data representing "3" (03h) is written to the third address (0003h) of the count information storage region. Thus, each time the rewriting processing is carried out, numeric value data directly representing a rewrite count of the flash memory 22 (corresponding to a value of each address of the count information storage region) is additionally written to each address of the count information storage region in ascending order of addresses starting from the top address. Therefore, for example, after the third rewriting processing is carried out, the respective addresses of the count information storage region have data values "01h, 02h, 03h, FFh, FFh, . . ." in ascending order of addresses starting from the top address. In this state, the data value 03h immediately preceding the first data value FFh (i.e., a maximum value among data values other than FFh) directly represents the current rewrite count of the flash memory 22.

At step S270 shown in FIG. 4, there may be provided such a modified arrangement that {value of the first register m-(address value of the top address of the count information storage region-1)} is assigned to the second register n. This modified arrangement is advantageous in that even if any bit of already written numeric value data is garbled, no adverse effect is given to numeric value data to be written later.

On the other hand, to attain a rewrite count of the flash memory 22 from data which is stored in the count information storage region through the rewrite count storing processing flow shown in FIG. 4, the rewrite count read-out processing at step S170 shown in FIG. 3 is carried out as shown in FIG. 5.

In the rewrite count read-out processing, the top address of the count information storage region of the flash memory 22 is assigned to the first register m in the microcomputer 8 at step S310.

Then, at step S320, data of the address m (i.e., an address matching a value of the first register m) is read from the count information storage region of the flash memory 22 to the RAM 26, in which it is determined whether the data of the address m is FFh or not.

If it is found at step S320 that the data of the address m is FFh (S320: YES), it signifies that count data is not yet written at the top address of the count information storage region, i.e., the rewriting processing is not yet performed at all. Therefore, in this case, step S330 is selected to assign "0" (=00h) to the second register n in the microcomputer 8 as a rewrite count of the flash memory 22. Thereafter, the rewrite count read-out processing is terminated.

At step S175 in FIG. 3, a determination is made to check whether or not a rewrite count of the flash memory 22 represented by a value assigned to the second register n through the rewrite count read-out processing is less than or equal to a predetermined value.

Contrarily, if it is found at step S320 that the data of the address m is not FFh (S320: NO), step S340 is selected to increment the value of the first register m by one. Then, at step S350, the data of the address m is read from the count information storage region to the RAM 26 in the same manner as at step S320. Then, it is determined whether the data of the address m is FFh or not. If the data of the address m is not FFh (S350: NO), step S340 is executed again.

If it is found at step S350 that the data of the address m is FFh (S350: YES), step S360 is selected to read data of address (m−1) from the count information storage region to the RAM 26. For the data of the address (m−1) thus read out, "data error determination and repair processing" is carried out.

In the data error determination and repair processing, it is checked whether any bit of the data of the address (m−1) is garbled or not. If the garbling of some bit is found in the data of the address (m−1), it is repaired to represent normal data. More specifically, in the data error determination and repair processing, it is checked whether or not the data value of the address (m−1) is equal to {(value of the first register m−1)−(address value of the top address of the count information storage region−1)}. If they are equal to each other, it is determined that the data of the address (m−1) is normal. Otherwise, it is determined that some bit of the data of the address (m−1) is garbled. In this case, the data value of the address (m−1) read onto the RAM 26 is replaced with {(value of the first register m−1)−(address value of the top address of the count information storage region−1)} for restoration to normal data.

Then, at step S370, as a rewrite count of the flash memory 22, the data value of the address (m−1) subjected to the data error determination and repair processing as mentioned above is assigned to the second register n in the microcomputer 8. Thereafter, the rewrite count read-out processing is terminated.

In other words, in the rewrite count read-out processing, a search is made for an address having data FFh (data-unwritten address) in the count information storage region in ascending order of addresses starting from the top address of the count information storage region (steps S310, S320, S340 and S350). Then, if the data of the top address is FFh (S320: YES), "0" (=00h) is assigned to the second register n as a rewrite count of the flash memory 22 (step S330). If the data of the top address is not FFh (S320: NO), a data value of the address immediately preceding an address having data FFh selected in the search is assigned to the second register n as a rewrite count of the flash memory 22 under normal condition (step S370). In the instance where the data value of the address immediately preceding the selected address having data FFh is not a normal value which is equal to the result of subtracting [address value of the top address of the count information storage region−1] from the address value of the selected address, it is determined that some bit is garbled. In this case, the value to be assigned to the second register n is replaced with the normal value as described above (step S360).

Therefore, for example, in case that the rewriting processing of step S190 shown in FIG. 3 has been carried out three times, a data value of address 0003h of the count information storage region is assigned to the second register n as a rewrite count of the flash memory 22 under normal condition. If the data value of address 0003h is not a normal value that is 03h (={0003h−(0001h−1)}), the normal value 03h is assigned to the second register n in lieu of the abnormal data value of address 0003h.

As detailed above, in the ECU 2 in the first preferred embodiment of the present invention, the rewrite count information storage region is provided at storage locations of 200 consecutive addresses in the flash memory 22. Instead of a conventional method of replacing the entire data in the count information storage region each time the rewriting processing is performed for the flash memory 22, the following method is used in the first preferred embodiment of the present invention. In each execution of the rewriting processing for the flash memory 22, a data-unwritten address in the count information storage region is selected in ascending order of addresses starting from the top address of the count information storage region, and numeric value data directly representing a rewrite count of the flash memory 22 is written to the address thus selected.

Therefore, unlike the conventional method in which the entire data in the count information storage region is replaced each time the rewriting processing is performed, there will not occur a trouble of losing a rewrite count due to an accidental disconnection of power to the ECU 2 during execution of the rewriting processing.

In the ECU 2 in the first preferred embodiment of the present invention, data to be additionally written in the count information storage region of the flash memory 22 is not a bit but numeric value data (count value data) directly representing a rewrite count of the flash memory 22. Therefore, when the ECU 2 sends addresses and data of the count information storage region to the memory rewriting device 14 through the processing of step S167 shown in FIG. 3 and the memory rewriting device 14 presents a dump list of the count information storage region on the display device, a repair shop mechanic can know the current rewrite count of the flash memory 22 easily for a task of rewriting the contents stored in the flash memory 22.

Referring to FIG. 6, there is shown an example of a dump list of the count information storage region which is provided at 200 consecutive storage locations from address FF38h to address FFFFh in the flash memory 22. In this example, up to 50 has been counted as a rewrite count of the flash memory 22. When checking the dump list, the mechanic can immediately recognize a maximum value among data values other than FFh at addresses therein (32h (=50) at address FF69h in this case). Thus, it is very easy for the mechanic to know that the current rewrite count of the flash memory 22 is 50.

Further, in the ECU 2 in the first preferred embodiment of the present invention, each time the rewriting processing is carried out, numeric value data directly representing a rewrite count of the flash memory 22 (corresponding to a value of each address) is additionally written to each address of the count information storage region in ascending order of addresses starting from the top address.

Therefore, even if any data bit in the count information storage region is garbled from "0" to "1" or vice versa, erroneous numeric value data due to "bit garbling" can be easily identified for correction. On this account, even if "bit garbling" occurs in the count information storage region, it is possible to attain an accurate rewrite count of the flash memory 22 with an extremely high probability of success.

That is, [address value of the top address of the count information storage region-1] is subtracted from an address value of each address of the count information storage region, and the resultant value of this subtraction is written to each address of the count information storage region. Therefore, if any numeric value data other than FFh ("1s" at all the bits) at respective addresses in the count information storage region does not correspond to each address value, it can be recognized that the numeric value data contains a garbled bit. Further, correct numeric value data can be attained easily from the address value of the bit-garbled numeric value data. The data error determination and repair processing at step S360 shown in FIG. 5 is carried out on the principle explained above.

In first preferred embodiment of the present invention, the memory rewriting device 14 lets its display device indicate a dump list of addresses and data of the count information storage region received from the ECU 2 as described above. In a modification, the following arrangement may be made.

If any numeric value data other than FFh does not correspond to each address value, the abnormal numeric value data is corrected to normal data (i.e., [address value of the top address of the count information storage region-1] is subtracted from the address value of the abnormal numeric value data) and then a dump list containing the normal data is presented on the display device.

Further, in the ECU 2 in the first preferred embodiment of the present invention, a predetermined value for determination at step S175 shown in FIG. 3 is set to 100, i.e., a value of up to 100 which is less than $126(=2^{(8-1)}-2)$ is handled as a rewrite count of the flash memory 22. Thus, correct numeric value data representing a rewrite count which has been written intentionally in the count information storage region can be positively distinguished from numeric value data containing a garbled bit which must be FFh ("1s" at all the bits), thereby making it possible to enhance accuracy of determination on a rewrite count in the event of "bit garbling".

More specifically, in case that any one bit is garbled in FFh at a data-unwritten address, there are eight possible patterns of garbled numeric value data which are not FFh. On rare occasion, when a rewrite count is smaller than any value of numeric value data in eight patterns by one, data of an address next to an address corresponding to an actual rewrite count may be garbled from FFh to numeric value data corresponding to an address value of the next address. In this situation, a value that is larger than the actual rewrite count by one is recognized erroneously as a rewrite count. For instance, when the actual rewrite count is 126, data of the 127th address from the top of the count information storage region may be garbled from FFh to 7Fh(=127) on rare occasion. In this instance, a value of 127 which is larger than the actual rewrite count by one is recognized erroneously as a rewrite count.

If the most significant bit of FFh is garbled to "0", a minimum value of 127 is indicated. Therefore, in case that a value of up to 126 is counted as a rewrite count of the flash memory 22, correct numeric value data which has been written intentionally in the count information storage region can be positively distinguished from numeric value data containing a garbled bit which must be FFh. Thus, accuracy of determination on a rewrite count can be enhanced in the event of "bit garbling". However, even if such a limitation on a rewrite count as mentioned above is not provided, erroneously recognizing a value that is larger than the actual rewrite count by one is a safety-region misinterpretation which will not pose a significant problem.

While a plurality of consecutive addresses are used for the count information storage region in the flash memory 22 in the ECU 2 in the first preferred embodiment of the present invention, there may also be provided such a modified arrangement that a plurality of non-consecutive addresses are used for the count information storage region. In this modified arrangement, at step S180 shown in FIG. 3, a data-unwritten address is selected in the count information storage region, and numeric value data representing a rewrite count of the flash memory 22 is written to the address thus selected. For address selection, although an ascending order of addresses is executed in general practice, it is also possible to employ a descending order of addresses.

In this modified arrangement, numeric value data directly representing a rewrite count is also additionally written into the count information storage region of the flash memory 22. Therefore, when a memory dump is produced, the mechanic can know a rewrite count of the flash memory 22 easily just by finding out a maximum data value other than FFh at addresses presented on the display device. Further, even if any bit is garbled in numeric value data in the count information storage region, the mechanic can easily identify and correct abnormal numeric data containing a garbled bit through examination on consecutiveness of numeric value strings sequenced in ascending order of addresses of the count information storage region.

(Second Embodiment)

Figure 8:
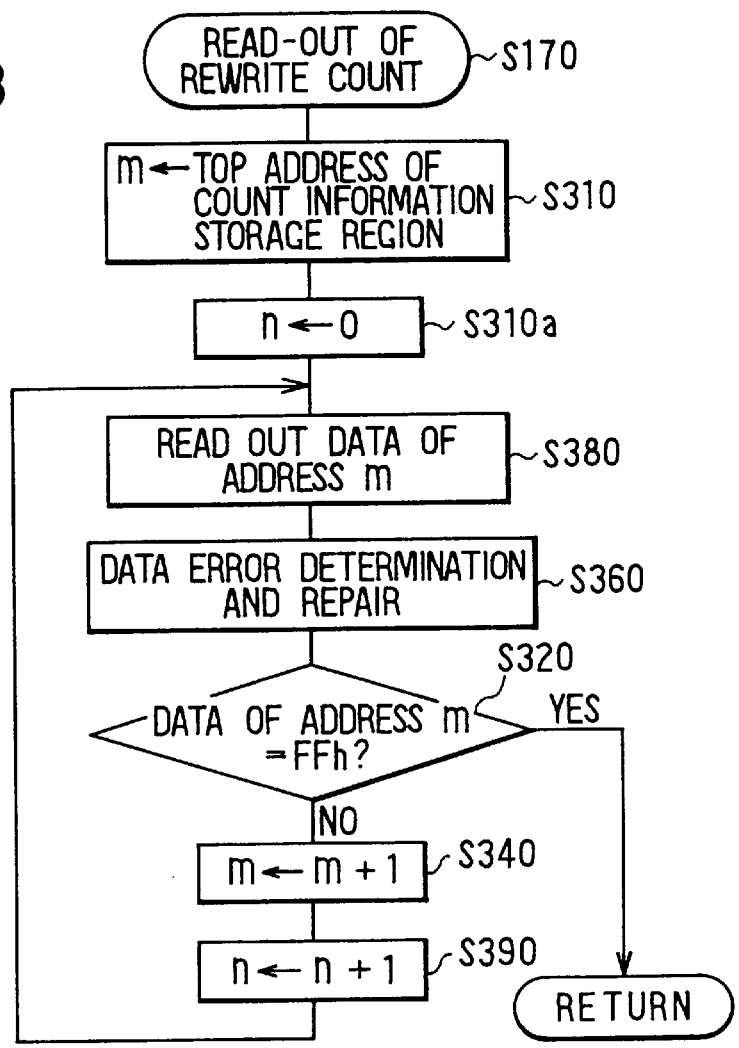
FIG. 8 is a flow diagram showing a rewrite count read-out processing procedure carried out in the ECU in the second preferred embodiment of the present invention.
Figure 9:
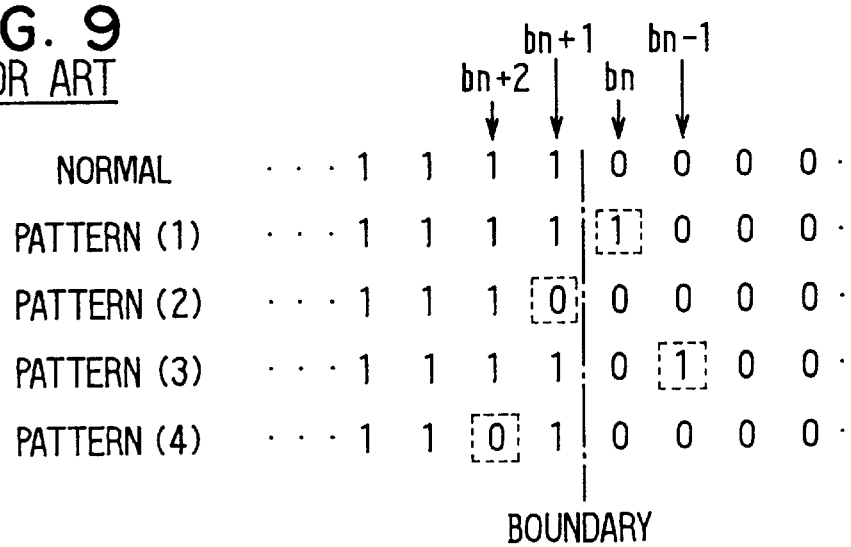
FIG. 9 is an explanatory diagram showing data patterns in the conventional electronic control unit.

As compared with the ECU 2 in the first preferred embodiment, the ECU in the second preferred embodiment is different in that a rewrite count storing processing procedure shown in FIG. 7 and a rewrite count read-out processing procedure shown in FIG. 8 are carried out.

With particular reference to FIGS. 7 and 8, the rewrite count storing processing and rewrite count read-out processing procedures to be carried out in the ECU in the second preferred embodiment of the present invention are explained below.

As shown in FIG. 7, in the rewrite count storing processing in the ECU according to the second preferred embodiment of the present invention, the top address of the count information storage region of the flash memory 22 is assigned to the first register m at step S210. Then, at step S220, data of the address m (i.e., an address matching a value of the first register m) is read from the count information storage region of the flash memory 22 to the RAM 26, so that it is determined whether the data of the address m is FFh or not.

If it is found at step S220 that the data of the address m is not FFh (S220: NO), step S250 is selected to increment the value of the first register m by one. Then, step S220 is executed again.

Contrarily, if it is found at step S220 that the data of the address m is FFh (S220: YES), step S260 is selected at which 00h representing a constant value of "0" is written to the address m of the count information storage region. Thereafter, the rewrite count storing processing is terminated.

More specifically, in the above rewrite count storing processing in the second preferred embodiment of the present invention, a search is made for a data-unwritten address having FFh in the count information storage region in ascending order of addresses starting from the top address of the count information storage region (steps S210 to S250), and then numeric value data representing "0" (00h) is written to the address which has been found to have data FFh (step S260).

Therefore, in the ECU in the second preferred embodiment of the present invention, each time the rewriting processing of step S190 shown in FIG. 3 is carried out, a data-unwritten address in the count information storage region is selected in ascending order of addresses starting from the top address of the count information storage region. Then, a value of 00h is written to the address thus selected. Accordingly, after the third rewriting processing is carried out, for example, the respective addresses of the count information storage region have data values "00h, 00h, 00h, FFh, FFh, . . ." in ascending order of addresses starting from the top address. In this state, a difference between the address value of the first FFh (0004h in this case) and the address value of the top address (0001h) represents the current rewrite count of the flash memory 22.

As shown in FIG. 8, in the rewrite read-out processing in the ECU according to the second preferred embodiment of the present invention, the top address of the count information storage region is assigned as an initial value to the first register m at step S310. Then, at step S310a, an initial value of "0" (=00h) is assigned to the second register n.

At step S380, data of the address m (i.e., an address matching a value of the first register m) is read from the count information storage region of the flash memory 22 to the RAM 26. Then, at step S360, the data error determination and repair processing is carried out for the data of the address m which has been read out at step S380.

In the data error determination and repair processing at step S360, it is checked whether any bit of the data of the address m is garbled or not. If the garbling of any bit is found in the data of the address m, it is repaired to represent normal data.

More specifically, the data error determination and repair processing at step S360 is carried out through the following procedures (1) to (3):

(1) It is checked whether or not the data of the address m is either of 00h and FFh. If the data of the address m is 00h or FFh, it is determined that the data of the address m is normal. Then, the data error determination and repair processing is terminated.

(2) Contrarily, if the data of the address m is neither 00h nor FFh, it is determined that any bit of the data of the address m is garbled. In this case, the number of bits "1" stored in the data of the address m is examined.

(3) Then, if the result of examination indicates that the number of bits "1" stored in the data of the address m is more than or equal to a predetermined value (e.g., 5), the data of the address m read onto the RAM 26 is replaced with FFh. On the contrary, if the result of examination indicates that the number of bits "1" is less than the predetermined value, the data of the address m read onto the RAM 26 is replaced with 00h. Thereafter, the data error determination and repair processing is terminated.

Then, at step S320, it is checked whether the data of the address m subjected to the data error determination and repair processing is FFh or not. If the data of the address m is not FFh (S320: NO), step S340 is selected to increment the value of the first register m by one. Then, at step S390, the value of the second register n is incremented by one, and control is returned to step S380.

At step S320, if it is found that the data of the address m subjected to the data error determination and repair processing is FFh (S320: YES), the rewrite count read-out processing is terminated.

In the ECU in the second preferred embodiment of the present invention, at step S175 shown in FIG. 3, a value assigned to the second register n through the rewrite count read-out processing flow diagramed in FIG. 8 is used as a rewrite count of the flash memory 22, i.e., a determination is made to check whether or not the value of the second register n is less than or equal to a predetermined value.

That is, in the rewrite count read-out processing in the second preferred embodiment of the present invention, a search is made for data-written addresses each having data other than FFh in the count information storage region in ascending order of addresses starting from the top address of the count information storage region (steps S310, S380, S320 and S340). Then, the number of data-written addresses thus found out is counted as a value of the second register n (steps S310A and S390), and the value of the second register n is used as a rewrite count of the flash memory 22. In the search operation mentioned above, if data read out of the count information storage region is neither 00h nor FFh, it is determined that any bit in the data is garbled. Then, according to the number of bits "1" in the abnormal data, it is determined whether the original normal data is 00h or FFh. Thus, the abnormal data is corrected to the normal data (S360), and thereafter a determination is made at step S320.

In the rewrite count read-out processing flow shown in FIG. 8, the following modified arrangement may be made instead of steps S310A and S390. If it is found at step S320 that the data of the address m is FFh (S320: YES), {value of the first register m–address value of the top address of the count information storage region} is assigned to the second register n as a rewrite count of the flash memory 22. Thereafter, the rewrite count read-out processing is terminated.

As detailed above, in the ECU in the second preferred embodiment of the present invention, the count information storage region is provided at storage locations of a plurality of consecutive addresses in the flash memory 22. Instead of the conventional method of replacing the entire data in the count information storage region each time the rewriting processing is performed for the flash memory 22, the following method is used in the second preferred embodiment of the present invention. In each execution of the rewriting processing for the flash memory 22, a data-unwritten address in the count information storage region is selected in ascending order of addresses starting from the top address of the count information storage region, and numeric value data representing "0" (00h) is written to the address thus selected.

Therefore, unlike the conventional method in which the entire data in the count information storage region is replaced each time the rewriting processing is performed, there will not occur a trouble of losing a rewrite count due to an accidental disconnection of power to the ECU during execution of the rewriting processing. Further, when the ECU sends addresses and data of the count information storage region to the memory rewriting device 14 through the processing of step S167 shown in FIG. 3 and the memory rewriting device 14 presents a dump list of the count information storage region on the display device, the mechanic can know the current rewrite count of the flash memory 22 easily for a task of rewriting the contents stored in the flash memory 22. For checking the current rewrite count of the flash memory 22, the mechanic has only to find out FFh ("1s" at all the bits) among data of the addresses presented on the display device in ascending order of addresses starting from the top address of the count information storage region and subtract an address value of the top address from an address value of the first FFh.

Still further, in the ECU in the second preferred embodiment of the present invention, a data value of each address in the count information storage region is either 00h or FFh under normal condition. Even if any bit of data in the count information storage region is garbled, it can be determined easily whether the erroneous data contains a bit garbled from 00h or a bit garbled from FFh. Therefore, even on occurrence of "bit-garbling" in the count information storage region, a misjudgment on a rewrite count of the flash memory 22 can be avoided.

In the second preferred embodiment of the present invention in particular, 00h is written which is the inverse of FFh in bit pattern representation using "1s" and "0s". Therefore, if any bit is garbled in the count information storage region, it can be positively determined whether the original normal data is 00h or FFh. This feature is highly effective for data checkup in practice. For example, if the number of bits "1" is more than or equal to a predetermined value, it can be determined that the original data is FFh. Otherwise, it can be determined that the original data is 00h. The data error determination and repair processing at step S360 shown in FIG. 5 is carried out on the principle explained above.

Although the rewrite program for carrying out the processing procedures at steps S165 to S190 shown in FIG. 3 is loaded from the memory rewriting device 14 onto the RAM 24 in the ECU 2 in each of the above preferred embodiments, there may be provided such a modified arrangement that the rewrite program is prestored in the masked ROM 24 and carried out thereon. In this modified arrangement, the processing procedures at steps S150 and S160 shown in FIG. 3 can be omitted.

Further, although the ECU 2 in each of the above preferred embodiments is intended for controlling a vehicle engine, it will be obvious to those skilled in the art that the present invention is also applicable to other electronic control devices for controlling such mechanisms as a brake, transmission and suspension in the same manner as set forth hereinabove.

While the present invention has been described in detail with respect to the first and second embodiments thereof, it is to be understood that the invention is not limited by any of the details of description and that various changes and modifications may be made in the invention without departing from the spirit and scope thereof.

What is claimed is:

1. An electronic control unit comprising:

an electrically erasable and rewritable read-only nonvolatile memory storing a control program and control data for a predetermined control object to be controlled, so that the control object is regulated in normal operation according to the control program and the control data stored in the nonvolatile memory, and rewriting processing is carried out to replace contents stored in the nonvolatile memory with contents received from an external device when a predetermined rewrite condition is met; and count storing processing means through which count information for indicating a rewrite count of the contents stored in the nonvolatile memory is stored into a count information storage region allocated in the nonvolatile memory each time the rewriting processing is carried out, wherein the count information storage region is set up as a memory area covering a plurality of addresses in the nonvolatile memory, and in each execution of the rewriting processing, the count storing processing means selects a data-unwritten address in the count information storage region, and then writes numeric value data representing a rewrite count of the contents stored in the nonvolatile memory to the selected address as the count information.

2. An electronic control unit as claimed in claim 1, wherein the count information storage region is set up as a memory area covering a plurality of consecutive addresses in the nonvolatile memory, and in each execution of the rewriting processing, the count storing processing means selects a data-unwritten address in the count information storage region in ascending order of addresses starting from the top address of the count information storage region, and then writes numeric value data representing a rewrite count of the contents stored in the nonvolatile memory to the selected address.

3. An electronic control unit comprising:

an electrically erasable and rewritable read-only nonvolatile memory storing a control program and control data for a predetermined control object to be controlled, so that the control object is regulated in normal operation according to the control program and control data stored in the nonvolatile memory, and rewriting processing is carried out to replace contents stored in the nonvolatile memory with new contents received from an external device when a predetermined rewrite condition is met; and count storing processing means through which count information for indicating a rewrite count of the contents stored in the nonvolatile memory is stored into a count information storage region allocated in the nonvolatile memory each time the rewriting processing is carried out, wherein the count information storage region is set up as a memory area covering a plurality of consecutive addresses in the nonvolatile memory, and in each execution of the rewriting processing, the count storing processing means selects a data-unwritten address in the count information storage region in ascending order of addresses starting from the top address of the count information storage region, and then writes numeric value data representing a predetermined constant value to the thus selected address as the count information.

4. An electronic control unit as claimed in claim 3, wherein the predetermined constant value is 0.

5. A method for storing count information indicating a rewrite count of contents stored in an electrically erasable and rewritable read-only nonvolatile memory into a count information storage region allocated in the nonvolatile memory so that an electronic control unit regulates a predetermined control object to be controlled in normal operation according to a control program and control data stored in the nonvolatile memory, and the electronic control unit carries out rewriting processing to replace the contents stored in the nonvolatile memory with new contents received from an external device when a predetermined rewrite condition is met, the nonvolatile memory rewrite count storing method comprising the steps of:

setting up a count information storage region as a memory area covering a plurality of addresses in the nonvolatile memory; and in each execution of the rewriting processing, selecting a data-unwritten address in the count information storage region, and then writing numeric data representing a rewrite count of the contents stored in the nonvolatile memory to the selected address as the count information.

6. A nonvolatile memory rewrite count storing method as claimed in claim 5, wherein the count information storage region is set up as a memory area covering a plurality of consecutive addresses in the nonvolatile memory, and in each execution of the rewriting processing, a data-unwritten address in the count information storage region is selected in ascending order of addresses starting from the top address of the count information storage region, and then numeric data representing a rewrite count of the contents stored in the nonvolatile memory is written to the thus selected address.

7. A method for storing count information indicating a rewrite count of contents stored in an electrically erasable and rewritable read-only nonvolatile memory into a count information storage region allocated in the nonvolatile memory so that an electronic control unit regulates a predetermined control object to be controlled in normal operation according to a control program and control data stored in the nonvolatile memory, and the electronic control unit carries out rewriting processing to replace the contents stored in the nonvolatile memory with new contents received from an external device when a predetermined rewrite condition is met, the nonvolatile memory rewrite count storing method comprising the steps of:

setting up a count information storage region as a memory area covering a plurality of consecutive addresses in the nonvolatile memory; and in each execution of the rewriting processing, selecting a data-unwritten address in the count information storage region in ascending order of addresses starting from the top address of the count information storage region, and then writing numeric value data representing a predetermined constant value to the selected address as the count information.

8. A nonvolatile memory rewrite count storing method as claimed in claim 7, wherein the predetermined constant value is 0.

* * * * *